United States Patent [19]

Kim et al.

[11] Patent Number: 5,652,535
[45] Date of Patent: Jul. 29, 1997

[54] NON-OVERLAPING SIGNAL GENERATION CIRCUIT

[75] Inventors: Kyung Yul Kim, Seoul; Jong Hoon Park, Kyungki-Do, both of Rep. of Korea

[73] Assignee: LG Semicon Co., Ltd., Cheongju, Rep. of Korea

[21] Appl. No.: 568,218

[22] Filed: Dec. 6, 1995

[30] Foreign Application Priority Data

Apr. 6, 1995 [KR] Rep. of Korea ............... 7986/1995

[51] Int. Cl.$^6$ ........................................ H03K 5/15
[52] U.S. Cl. ..................... 327/259; 327/239; 327/295
[58] Field of Search ........................... 327/259, 239, 327/23, 22, 295, 176

[56] References Cited

U.S. PATENT DOCUMENTS

| 4,417,158 | 11/1983 | Ito et al. ........................ 327/295 |
| 4,625,126 | 11/1986 | Tinker et al. .................. 327/259 |
| 4,645,947 | 2/1987 | Prak ................................ 327/259 |
| 5,047,659 | 9/1991 | Ullrich ........................... 327/259 |
| 5,389,831 | 2/1995 | Eisenstadt ..................... 327/239 |
| 5,444,405 | 8/1995 | Truong et al. ................ 327/239 |
| 5,495,189 | 2/1996 | Choi ............................... 327/259 |

FOREIGN PATENT DOCUMENTS 63-253715  10/1988  Japan ....................... 327/259

*Primary Examiner*—Timothy P. Callahan
*Assistant Examiner*—Terry L. Englund
*Attorney, Agent, or Firm*—Fleshner & Kim

[57] ABSTRACT

A non-overlapping signal generation circuit comprising a NOR gate for NORing a chip select signal and an address signal, an inverter for inverting an output signal from the NOR gate, a first inversion circuit for sequentially inverting an output signal from the inverter by an odd number of times, a second inversion circuit for sequentially inverting the output signal from the inverter by an even number of times, an address transition detector for generating an address transition detect signal in response to the output signal from the inverter, and a non-overlapping signal generator for generating an enable signal and a disable signal in response to the address transition detect signal from the address transition detector and output signals from the first and second inversion circuits, the enable signal and the disable signal non-overlapping with each other. According to the present invention, the enable signal and the disable signal can be generated with their high levels accurately non-overlapping with each other for an active pulse duration of the address transition detect signal.

5 Claims, 6 Drawing Sheets

5,652,535

NON-OVERLAPING SIGNAL GENERATION CIRCUIT

BACKGROUND OF THE INVENTION

1. Field of the Invention

The present invention relates in general to the generation of non-overlapping signals, and more particularly to a non-overlapping signal generation circuit in which an enable signal and a disable signal to be applied to an address signal decoder are generated in response to a pulse signal from an address transition detector, while accurately non-overlapping with each other.

2. Description of the Prior Art

Referring to FIG. 1, there is shown a circuit diagram of a conventional non-overlapping signal generation circuit. As shown in this drawing, the conventional non-overlapping signal generation circuit comprises a NOR gate 10 for NORing a chip select signal /CS and an address signal Ai, a first inverter 20 for inverting an output signal from the NOR gate 10, a latch circuit 30 for latching the output signal from the NOR gate 10 and an output signal from the first inverter 20, a second inverter 40 for inverting a first output signal from the latch circuit 30, a third inverter 41 for inverting an output signal from the second inverter 40, and a fourth inverter 42 for inverting an output signal from the third inverter 41 and outputting the inverted signal as an enable signal AN to a decoder (not shown).

The conventional non-overlapping signal generation circuit further comprises a fifth inverter 43 for inverting a second output signal from the latch circuit 30, a sixth inverter 44 for inverting an output signal from the fifth inverter 43, a seventh inverter 45 for inverting an output signal from the sixth inverter 44 and outputting the inverted signal as a disable signal ANB to the decoder, and an address transition detector 50 for generating an address transition detect signal ATDN in response to the first and second output signals from the latch circuit 30.

The NOR gate 10 includes first and second PMOS transistors 11 and 12 and first and second NMOS transistors 13 and 14. The first PMOS transistor 11 has a gate for inputting the address signal Ai and a source for inputting a supply voltage VCC. The second PMOS transistor 12 has a source connected to a drain of the first PMOS transistor 11 and a gate for inputting the chip select signal /CS. The first NMOS transistor 13 has a drain connected to a drain of the second PMOS transistor 12, a gate for inputting the address signal Ai and a source for inputting a ground voltage VSS. The second NMOS transistor 14 has a gate for inputting the chip select signal /CS, a source for inputting the ground voltage Vss and a drain connected to a first node N1. The first node N1 is connected in common to' the drains of the second PMOS transistor 12, first NMOS transistor 13 and second NMOS transistor 14 and an input terminal of the first inverter 20.

The latch circuit 30 includes first and second NAND gates 31 and 32. The first NAND gate 31 is adapted to NAND the output signal from the first inverter 20 and an output signal from the second NAND gate 32. The second NAND gate 32 is adapted to NAND the output signal from the NOR gate 10 and an output signal from the first NAND gate 31. A second node N2 is positioned between an output terminal of the first inverter 20 and one input terminal of the first NAND gate 31. A third node N3 is connected in common to an output terminal of the first NAND gate 31, an input terminal of the second inverter 40, one input terminal of the address transition detector 50 and one input terminal of the second NAND gate 32, the other input terminal of which is connected to the input terminal of the first inverter 20. A fourth node N4 is connected in common to an output terminal of the second NAND gate 32, the other input terminal of the first NAND gate 31, an input terminal of the fifth inverter 43 and the other input terminal of the address transition detector 50.

Noticeably, there may be provided non-overlapping signal generation circuits of the same number as that of address signal bits. For the convenience, the description will hereinafter be made with respect to only the non-overlapping signal generation circuit corresponding to one address signal bit Ai.

Now, the operation of, the conventional non-overlapping signal generation circuit with the above-mentioned construction will be described in detail with reference to FIGS. 2A to 2H.

First, when the chip select signal /CS is low in level, the non-overlapping signal generation circuit is selected. In this case, the second PMOS transistor 12 in the NOR gate 10 is turned on, whereas the second NMOS transistor 14 therein is turned off.

The operation of the conventional non-overlapping signal generation circuit will first be mentioned with respect to the case where the address signal Ai makes a low to high transition.

In the case where the address signal Ai goes from low to high in level as shown in FIG. 2A, the first PMOS transistor 11 in the NOR gate 10 is turned off, whereas the first NMOS transistor 13 therein is turned on. Because the second PMOS transistor 12 and the second NMOS transistor 14 in the NOR gate 10 were previously turned on and off, respectively, a signal on the first node N1 goes from high to low in level as shown in FIG. 2B.

The first inverter 20 inverts the signal on the first node N1 from low to high in level and outputs the resultant signal as shown in FIG. 2C to the second node N2. The high level signal on the second node N2 is applied to the one input terminal of the first NAND gate 31 in the latch circuit 30. As a result, a signal level on the third node N3 is determined depending on that at the other input terminal of the first NAND gate 31.

The low level signal on the first node N1 is applied to the other input terminal of the second NAND gate 32 in the latch circuit 30. As a result, the second NAND gate 32 outputs a low to high transition signal as shown in FIG. 2E to the fourth node N4 regardless of a signal level at its one input terminal. The high level signal on the fourth node N4 is applied to the other input terminal of the first NAND gate 31.

Subsequently, the signal on the third node N3 goes from high to low in level as shown in FIG. 2D.

In result, the signal on the third node N3 makes the transition later than that on the fourth node N4 by a delay time of the second NAND gate 32.

The signal on the fourth node N4 is sequentially inverted by the fifth to seventh inverters 43–45 and applied to the decoder as the disable signal ANB which goes from high to low in level as shown in FIG. 2G.

Then, the signal on the third node N3 is sequentially inverted by the second to fourth inverters 40–42 and applied to the decoder as the enable signal AN which goes from low to high in level as shown in FIG. 2F. The enable signal AN makes the transition later than the disable signal ANB by the delay time of the second NAND gate 32.

Therefore, the enable signal AN and the disable signal ANB are applied to the decoder, with their high levels non-overlapping with each other by the delay time of the second NAND gate 32.

In response to the signals on the third and fourth nodes N3 and N4, the address transition detector 50 generates the address transition detect signal ATDN which is a high level pulse signal as shown in FIG. 2H.

Next, the operation of the conventional non-overlapping signal generation circuit will be mentioned with respect to the case where the address signal Ai makes a high to low transition.

In the case where the address signal Ai goes from high to low in level as shown in FIG. 2A, the first PMOS transistor 11 in the NOR gate 10 is turned on, whereas the first NMOS transistor 13 therein is turned off. Because the second PMOS transistor 12 and the second NMOS transistor 14 in the NOR gate 10 were previously turned on and off, respectively, the signal on the first node N1 goes from low to high in level as shown in FIG. 2B.

The first inverter 20 inverts the signal on the first node N1 from high to low in level and outputs the resultant signal as shown in FIG. 2C to the second node N2.

The low level signal on the second node N2 is applied to the one input terminal of the first NAND gate 31 in the latch circuit 30. As a result, the first NAND gate 31 outputs a low to high transition signal as shown in FIG. 2D to the third node N3 regardless of a signal level at its other input terminal.

Subsequently, the signal on the fourth node N4 goes from high to low in level as shown in FIG. 2E in response to the high level signal on the third node N3 and the high level signal on the first node N1.

In result, the signal on the fourth node N4 makes the transition later than that on the third node N3 by a delay time of the first NAND gate 31.

The signal on the third node N3 is sequentially inverted by the second to fourth inverters 40–42 and applied to the decoder as the enable signal AN which goes from high to low in level as shown in FIG. 2F.

Then, the signal on the fourth node N4 is sequentially inverted by the fifth to seventh inverters 43–45 and applied to the decoder as the disable signal ANB which goes from low to high in level as shown in FIG. 2G. The disable signal ANB makes the transition later than the enable signal AN by the delay time of the first NAND gate 31.

Therefore, the enable signal AN and the disable signal ANB are applied to the decoder, with their high levels non-overlapping with each other by the delay time of the first NAND gate 31.

In response to the signals on the third and fourth nodes N3 and N4, the address transition detector 50 generates the address transition detect signal ATDN which is the high level pulse signal as shown in FIG. 2H.

However, the above-mentioned conventional non-overlapping signal generation circuit has a disadvantage in that the delay times of the NAND gates are not constant due to variations in input voltages and temperatures of transistors us&d in the NAND gates. For this reason, the enable signal and the disable signal cannot be generated with their high levels accurately non-overlapping with each other. In order to solve such a problem, the transistors may be optimized in size by the user. Unfortunately, it is actually difficult to optimize the transistor size.

SUMMARY OF THE INVENTION

Therefore, the present invention has been made in view of the above problem, and it is an object of the present invention to provide a non-overlapping signal generation circuit in which an enable signal and a disable signal can be generated in response to a pulse signal from an address transition detector, with their high levels accurately non-overlapping with each other.

In accordance with the present invention, the above and other objects can be accomplished by a provision of a non-overlapping signal generation circuit comprising NORing means for NORing a chip select signal and an address signal; first inversion means for inverting an output signal from the NORing means; second inversion means for sequentially inverting an output signal from the first inversion means by an odd number of times; third inversion means for sequentially inverting the output signal from the first inversion means by an even number of times; address transition detection means for generating an address transition detect signal in response to the output signal from the first inversion means; and non-overlapping signal generation means for generating an enable signal and a disable signal in response to the address transition detect signal from the address transition detection means and output signals from the second and third inversion means, the enable signal and the disable signal non-overlapping with each other.

The address signal and the chip select signal are logically combined together and the resultant signal is inverted by the odd number of times. The resultant signal is also inverted by the even number of times. The inverted signals are logically combined with the address transition detect signal, respectively. As a result of the logic combination, the enable signal and the disable signal are generated while accurately non-overlapping with each other.

BRIEF DESCRIPTION OF THE DRAWINGS

The above and other objects, features and advantages of the present invention will be more clearly understood from the following detailed description taken in conjunction with the accompanying drawings, in which:

FIG. 2A–H are a timing diagram illustrating the operation of the conventional non-overlapping signal generation circuit in FIG. 1, wherein:

FIG. 2A is a waveform diagram of an address signal;

FIG. 2B is a waveform diagram of a signal appearing on a first node;

FIG. 2C is a waveform diagram of a signal appearing on a second node;

FIG. 2D is a waveform diagram of a signal appearing on a third node;

FIG. 2E is a waveform diagram of a signal appearing on a fourth node;

FIG. 2F is a waveform diagram of an enable signal;

FIG. 2G is a waveform diagram of a disable signal; and

FIG. 2H is a waveform diagram of an address transition detect signal;

FIG. 4A–H are a timing diagram illustrating the operation of the non-overlapping signal generation circuit in FIG. 3, wherein:

FIG. 4A is a waveform diagram of an address signal;

FIG. 4B is a waveform diagram of a signal appearing on a first node;

FIG. 4C is a waveform diagram of a signal appearing on a second node;

FIG. 4D is a waveform diagram of a signal appearing on a third node;

FIG. 4E is a waveform diagram of a signal appearing on a fourth node;

FIG. 4F is a waveform diagram of an address transition detect signal;

FIG. 4G is a waveform diagram of an enable signal; and

FIG. 4H is a waveform diagram of a disable signal;

FIG. 6A–H are a timing diagram illustrating the operation of the non-overlapping signal generation circuit in FIG. 5, wherein:

FIG. 6A is a waveform diagram of an address signal;

FIG. 6B is a waveform diagram of a signal appearing on a first node;

FIG. 6C is a waveform diagram of a signal appearing on a second node;

FIG. 6D is a waveform diagram of a signal appearing on a third node;

FIG. 6E is a waveform diagram of a signal appearing on a fourth node;

FIG. 6F is a waveform, diagram of an address transition detect signal;

FIG. 6G is a waveform diagram of a signal appearing on a fifth node;

FIG. 6H is a waveform diagram of a signal appearing on a sixth node;

FIG. 6I is a waveform diagram of an enable signal; and

FIG. 6J is a waveform diagram of a disable signal.

DETAILED DESCRIPTION OF THE PREFERRED EMBODIMENTS

Figure 3:
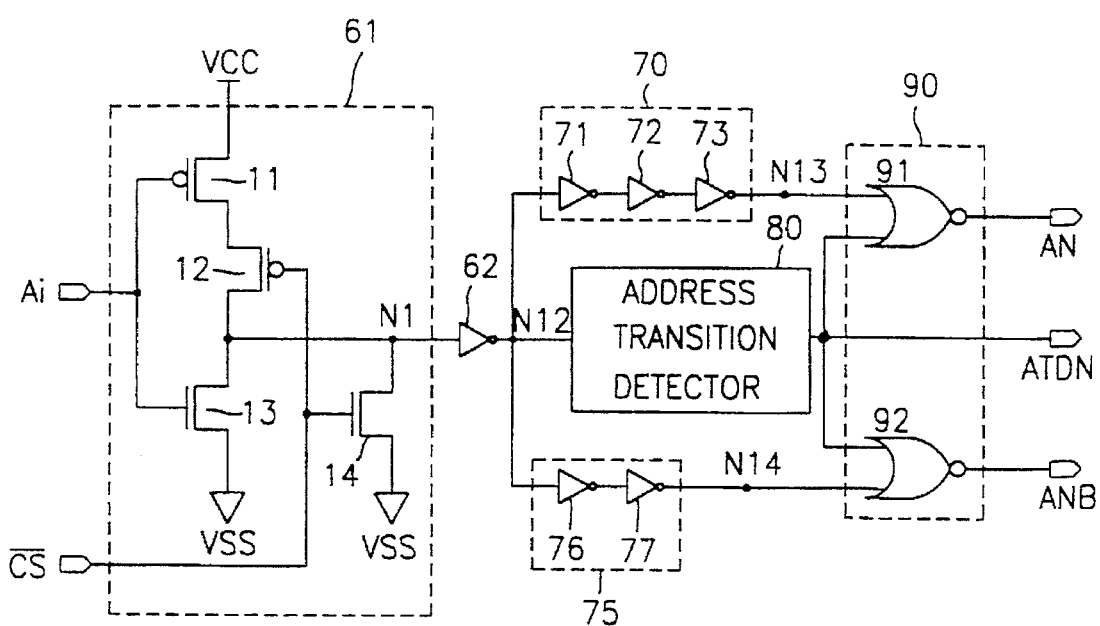
FIG. 3 is a circuit diagram of a non-overlapping signal generation circuit in accordance with an embodiment of the present invention.

Referring to FIG. 3, there is shown a circuit diagram of a non-overlapping signal generation circuit in accordance with an embodiment of the present invention. As shown in this drawing, the non-overlapping signal generation circuit comprises a first NOR gate 61 for NORing a chip select signal /CS and an address signal Ai, a first inverter 62 for inverting an output signal from the first NOR gate 61, a first inversion circuit 70 for sequentially inverting an output signal from the first inverter 62 by an odd number of times, a second inversion circuit 75 for sequentially inverting the output signal from the first inverter 62 by an even number of times, an address transition detector 80 for generating an address transition detect signal ATDN in response to the output signal from the first inverter 62, and a non-overlapping signal generator 90 for generating an enable signal AN and a disable signal ANB in response to the address transition detect signal ATDN from the address transition detector 80 and output signals from the first and second inversion circuits 70 and 75, the enable signal AN and the disable signal ANB non-overlapping with each other.

Figure 1:
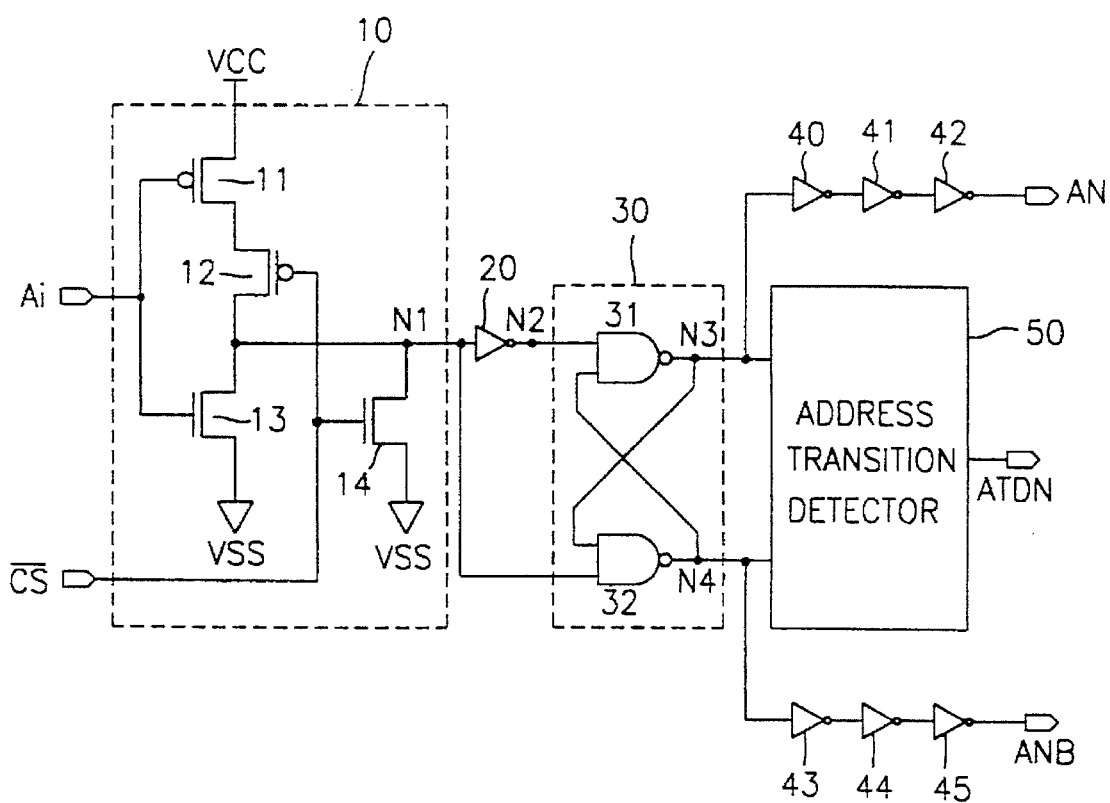
FIG. 1 is a circuit diagram of a conventional non-overlapping signal generation circuit.
Figure 2:
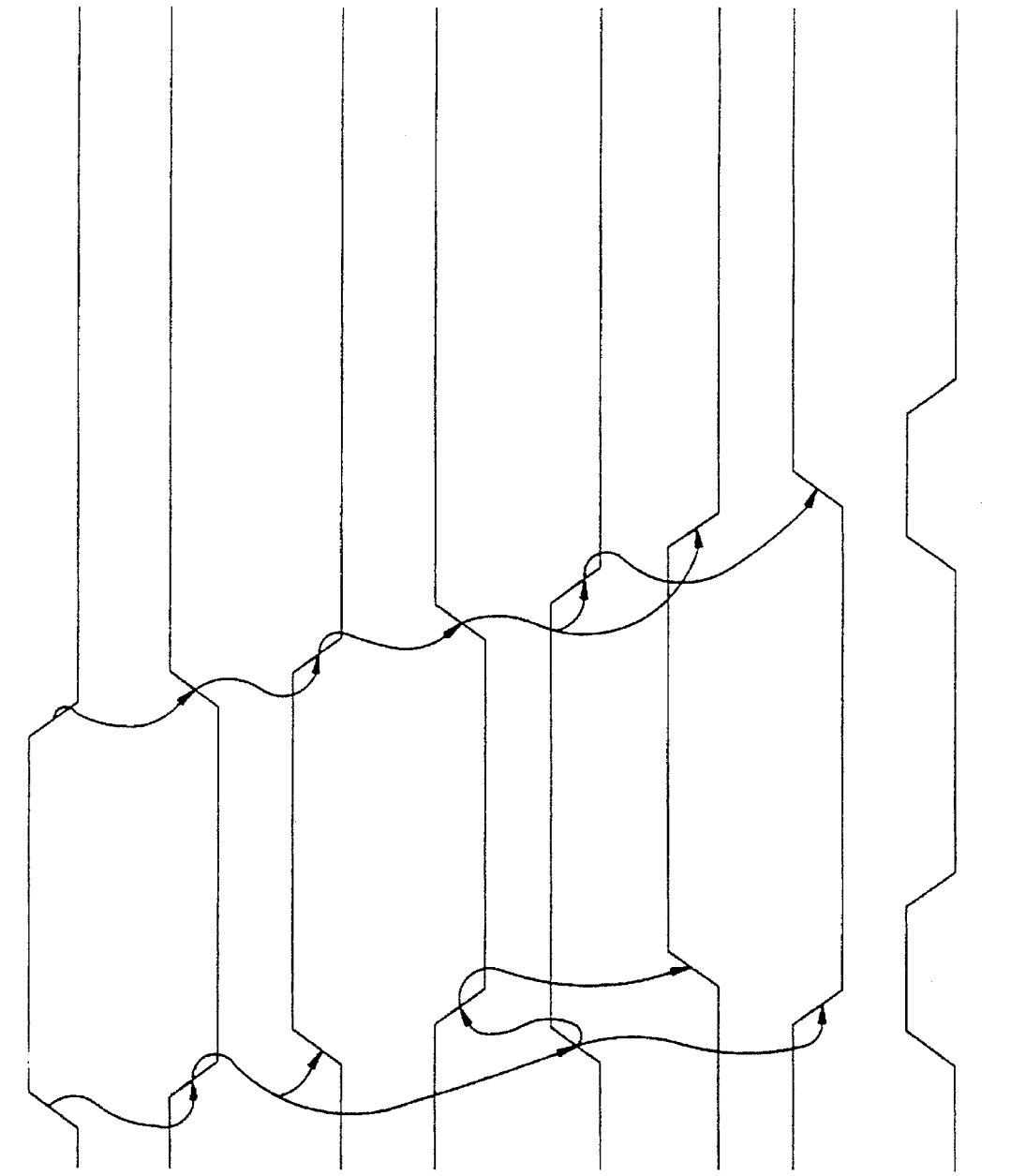

The first NOR gate 61 is the same in construction as the NOR gate 10 in FIG. 1 and details thereof will thus be omitted.

The first inversion circuit 70 includes a second inverter 71 for inverting the output signal from the first inverter 62, a third inverter 72 for inverting an output signal from the second inverter 71, and a fourth inverter 73 for inverting an output signal from the third inverter 72.

The second inversion circuit 75 includes a fifth inverter 76 for inverting the output signal from the first inverter 62, and a sixth inverter 77 for inverting an output signal from the fifth inverter 76.

The non-overlapping signal generator 90 includes a second NOR gate 91 for NORing an output signal from the fourth inverter 73 in the first inversion circuit 70 and the address transition detect signal ATDN from the address transition detector 80 and outputting the resultant signal as the enable signal AN to a decoder (not shown), and a third NOR gate 92 for NORing an output signal from the sixth inverter 77 in the second inversion circuit 75 and the address transition detect signal ATDN from the address transition detector 80 and outputting the resultant signal as the disable signal ANB to the decoder.

The first node N1 is connected in common to the drains of the second PMOS transistor 12, first NMOS transistor 13 and second NMOS transistor 14 and an input terminal of the first inverter 62, in a similar manner to that in FIG. 1. A second node N12 is connected in common to an output terminal of the first inverter 62, an input terminal of the second inverter 71 in the first inversion circuit 70, an input terminal of the fifth inverter 76 in the second inversion circuit 75, and an input terminal of the address transition detector 80. A third node N13 is positioned between an output terminal of the fourth inverter 73 in the first inversion circuit 70 and one input terminal of the second NOR gate 91 in the non-overlapping signal generator 90, the other input terminal of which is connected to an output terminal of the address transition detector 80. A fourth node N14 is positioned between an output terminal of the sixth inverter 77 in the second inversion circuit 75 and one input terminal of the third NOR gate 92 in the non-overlapping signal generator 90, the other input terminal of which is connected to the output terminal of the address transition detector 80.

Noticeably, there may be provided non-overlapping signal generation circuits of the same number as that of address signal bits. For the convenience, the description will hereinafter be made with respect to only the non-overlapping signal generation circuit corresponding to one address signal bit Ai.

Now, the operation of the non-overlapping signal generation circuit with the above-mentioned construction in accordance with the embodiment of the present invention will be described in detail with reference to FIGS. 4A to 4H.

First, when the chip select signal /CS is low in level, the non-overlapping signal generation circuit is selected.

The operation of the non-overlapping signal generation circuit will first be mentioned with respect to the case where the address signal Ai makes a low to high transition.

Figures 4A, 4B, 4C, 4D, 4E, 4F, 4G, 4H:
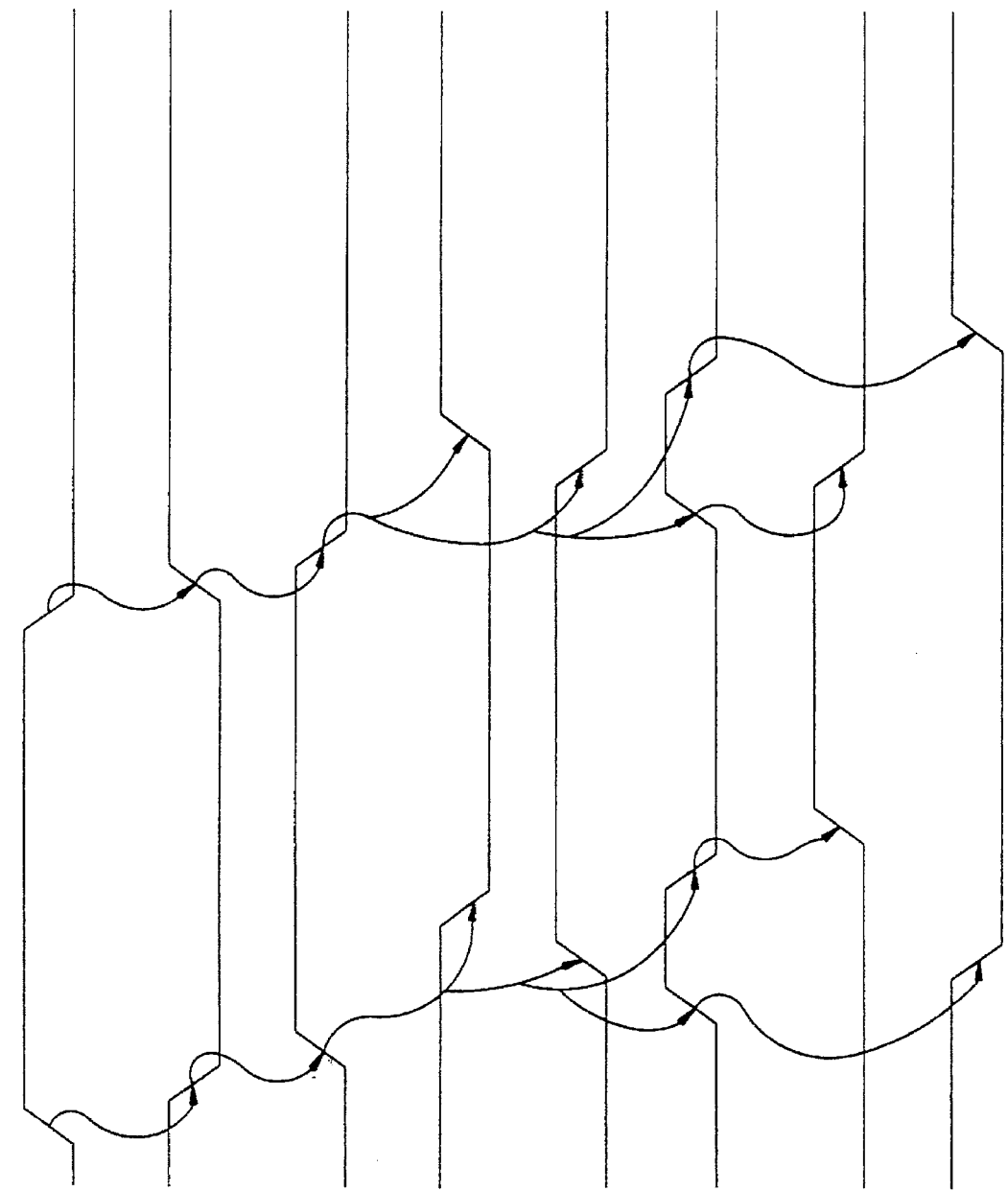

In the case where the address signal Ai goes from low to high in level as shown in FIG. 4A, a signal on the first node N1 goes from high to low in level as shown in FIG. 4B in a similar manner to that in FIG. 1.

The first inverter 62 inverts the signal on the first node N1 from low to high in level and outputs the resultant signal as shown in FIG. 4C to the second node N12.

The signal on the second node N12 is sequentially inverted by the second to fourth inverters 71–73 in the first inversion circuit 70. As a result, a signal on the third node N13 goes from high to low in level as shown in FIG. 4D.

The signal on the second node N12 is also sequentially inverted by the fifth and sixth inverters 76 and 77 in the second inversion circuit 75. As a result, a signal on the fourth node N14 goes from low to high in level as shown in FIG. 4E.

As the signal on the second node N12 goes from low to high in level, the address transition detector 80 generates the address transition detect signal ATDN which remains at its high level state for a predetermined time period as shown in FIG. 4F.

The second NOR gate 91 in the non-overlapping signal generator 90 performs its NOR operation with respect to the low level signal on the third node N13 and the high level address transition detect signal ATDN from the address transition detector 80. As a result of the NOR operation, the second NOR gate 91 generates the enable signal AN which is low in level as shown in FIG. 4G. Then, the second NOR gate 91 outputs the resultant enable signal AN to the decoder. When the predetermined time period has elapsed, the address transition detect signal ATDN goes from high to low in level, thereby causing the enable signal AN to become high in level.

The third NOR gate 92 in the non-overlapping signal generator 90 performs its NOR operation with respect to the high level signal on the fourth node N14 and the high level address transition detect signal ATDN from the address transition detector 80. As a result of the NOR operation, the third NOR gate 92 generates the disable signal ANB which goes from high to low in level as shown in FIG. 4H. Then, the third NOR gate 92 outputs the resultant disable signal ANB to the decoder. When the predetermined time period has elapsed, the address transition detect signal ATDN goes from high to low in level, but the disable signal ANB remains at its low level state.

In result, the enable signal AN and the disable signal ANB are generated with their high levels non-overlapping for the predetermined time period that the address transition detect signal ATDN remains at its high level state.

Next, the operation of the non-overlapping signal generation circuit will be mentioned with respect to the case where the address signal Ai makes a high to low transition.

In the case where the address signal Ai goes from high to low in level as shown in FIG. 4A, the signal on the first node N1 goes from low to high in level as shown in FIG. 4B in a similar manner to that in FIG. 1.

The first inverter 62 inverts the signal on the first node N1 from high to low in level and outputs the resultant signal as shown in FIG. 4C to the second node N12.

The signal on the second node N12 is sequentially inverted by the second to fourth inverters 71–73 in the first inversion circuit 70. As a result, the signal on the third node N13 goes from low to high in level as shown in FIG. 4D.

The signal on the second node N12 is also sequentially inverted by the fifth and sixth inverters 76 and 77 in the second inversion circuit 75. As a result, the signal on the fourth node N14 goes from high to low in level as shown in FIG. 4E.

As the signal on the second node N12 goes from high to low in level, the address transition detector 80 generates the address transition detect signal ATDN which remains at its high level state for the predetermined time period as shown in FIG. 4F.

The second NOR gate 91 in the non-overlapping signal generator 90 performs its NOR operation with respect to the high level signal on the third node N13 and the high level address transition detect signal ATDN from the address transition detector 80. As a result of the NOR operation, the second NOR gate 91 generates the enable signal AN which goes from high to low in level as shown in FIG. 4G. Then, the second NOR gate 91 outputs the resultant enable signal AN to the decoder. When the predetermined time period has elapsed, the address transition detect signal ATDN goes from high to low in level, but the enable signal AN remains at its low level state.

The third NOR gate 92 in the non-overlapping signal generator 90 performs its NOR operation with respect to the low level signal on the fourth node N14 and the high level address transition detect signal ATDN from the address transition detector 80. As a result of the NOR operation, the third NOR gate 92 generates the disable signal ANB which is low in level as shown in FIG. 4H. Then, the third NOR gate 92 outputs the resultant disable signal ANB to the decoder. When the predetermined time period has elapsed, the address transition detect signal ATDN goes from high to low in level, thereby causing the disable signal ANB to become high in level.

In result, the enable signal AN and the disable signal ANB are generated with their high levels non-overlapping for the predetermined time period that the address transition detect signal ATDN remains at its high level state.

Figure 5:
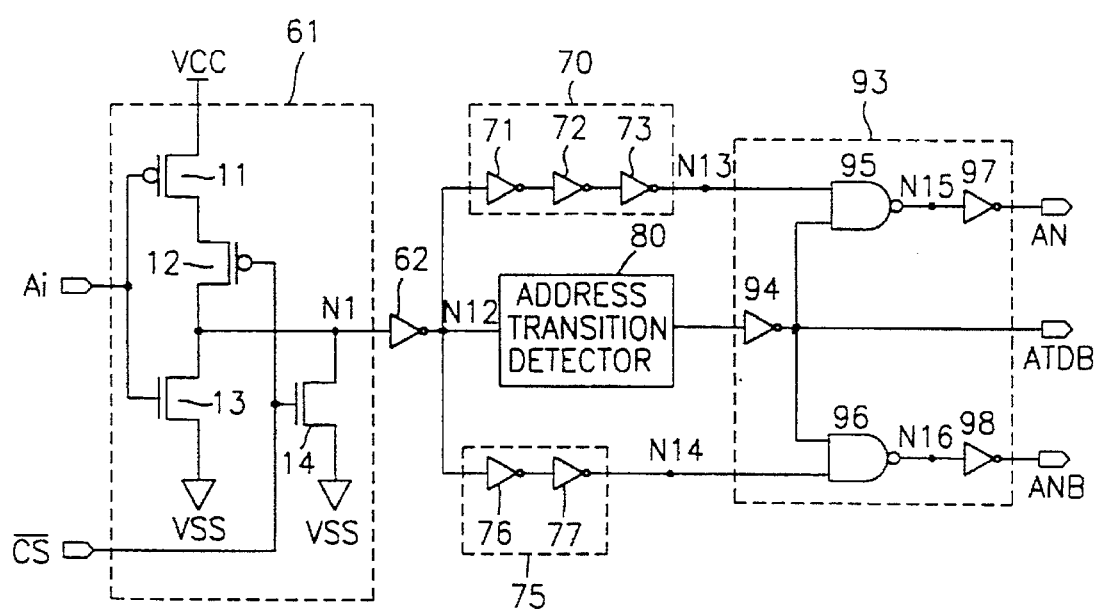
FIG. 5 is a circuit diagram of a non-overlapping signal generation circuit in accordance with an alternative embodiment of the present invention.

Referring to FIG. 5, there is shown a circuit diagram of a non-overlapping signal generation circuit in accordance with an alternative embodiment of the present invention. The second embodiment in FIG. 5 is substantially the same in construction as the first embodiment in FIG. 3, with the exception that a non-overlapping signal generator 93 is different in construction from the non-overlapping signal generator 90. Thus, only the construction of the non-overlapping signal generator 93 will hereinafter be mentioned.

The non-overlapping signal generator 93 includes a seventh inverter 94 for inverting the address transition detect signal ATDN from the address transition detector 80 and outputting the resultant address transition detect signal ATDB, a first NAND gate 95 for NANDing the address transition detect signal ATDB from the seventh inverter 94 and the output signal from the fourth inverter 73 in the first inversion circuit 70, a second NAND gate 98 for NANDing the address transition detect signal ATDB from the seventh inverter 94 and the output signal from the sixth inverter 77 in the second inversion circuit 75, an eighth inverter 97 for inverting an output signal from the first NAND gate 95 and outputting the resultant signal as the enable signal AN, and a ninth inverter 98 for inverting an output signal from the second NAND gate 96 and outputting the resultant signal as the disable signal ANB. A fifth node N15 is positioned between an output terminal of the first NAND gate 95 and an input terminal of the eighth inverter 97. A sixth node N16 is positioned between an output terminal of the second NAND gate 96 and an input terminal of the ninth inverter 98.

The operation of the non-overlapping signal generation circuit with the above-mentioned construction in accordance with the alternative embodiment of the present invention will hereinafter be described in detail with reference to FIGS. 6A to 6J.

The second embodiment in FIG. 5 is substantially the same in operation as the first embodiment in FIG. 3, with the exception that the non-overlapping signal generator 93 is different in operation from the non-overlapping signal generator 90. Thus, only the operation of the non-overlapping signal generator 93 will hereinafter be mentioned. Also, the address transition detect signal ATDN from the address transition detector 80 is inverted by the seventh inverter 94 in the non-overlapping signal generator 93. In this connection, the address transition detect signal ATDB as shown in FIG. 6F has the opposite level to that of the address transition detect signal ATDN as shown in FIG. 4F.

Figures 6A, 6B, 6C, 6D, 6E, 6F, 6G, 6H, 6I, 6J:
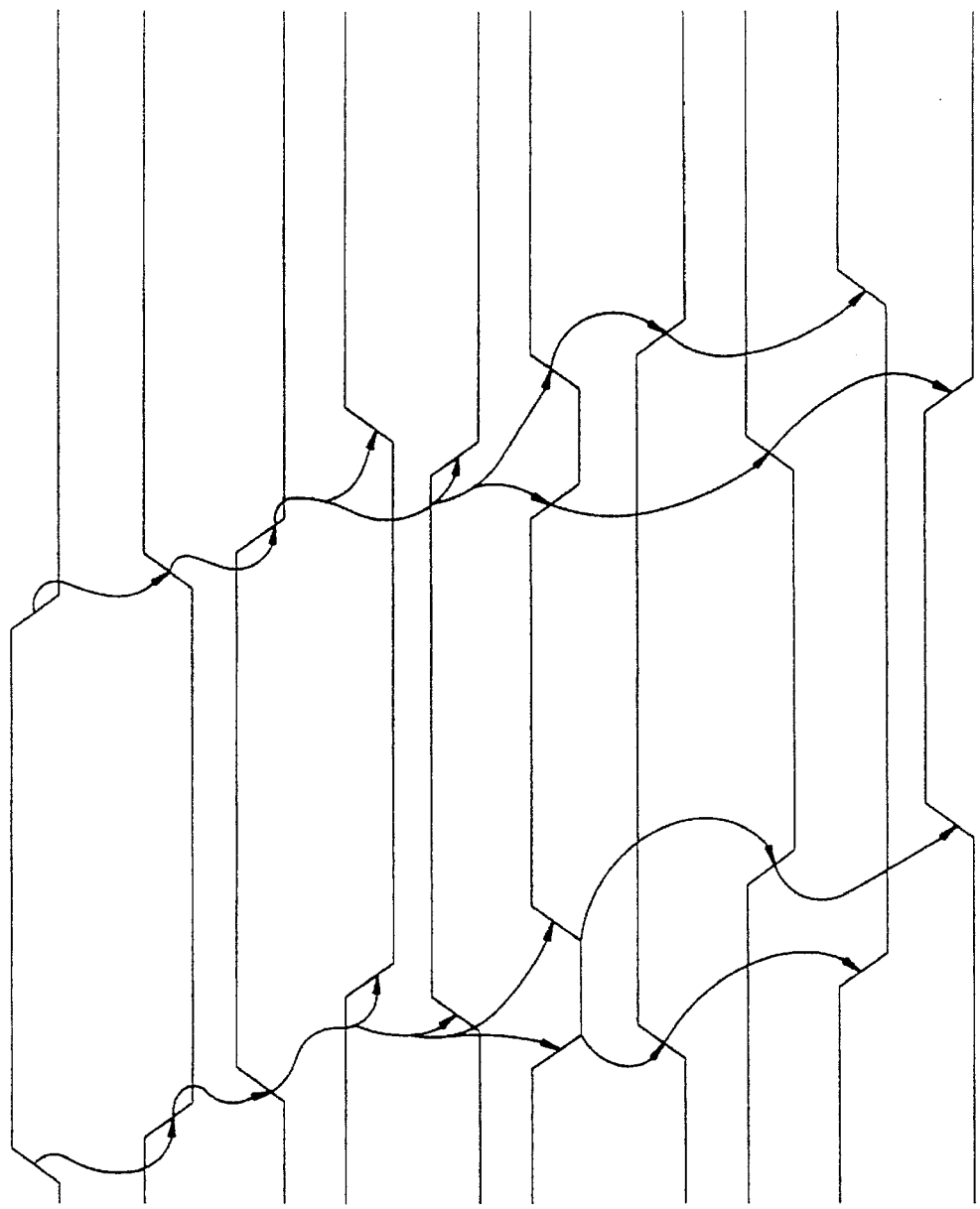

In the case where the address signal Ai goes from low to high in level as shown in FIG. 6A, the seventh inverter 94 generates the address transition detect signal ATDB which remains at its low level state for a predetermined time period as shown in FIG. 6F. The first NAND gate 95 performs its NAND operation with respect to the low level address transition detect signal ATDB and the low level signal on the third node N13. As a result of the NAND operation, a signal on the fifth node N15 goes from low to high in level as shown in FIG.

When the predetermined time period has elapsed, the address transition detect signal ATDB goes from low to high in level. The second NAND gate 96 performs its NAND operation with respect to the high level address transition detect signal ATDB and the high level signal on the fourth node N14. As a result of the NAND operation, a signal on the sixth node N16 goes from high to low in level as shown in FIG. 6H.

The eighth inverter 97 inverts the signal on the fifth node N15 and outputs the resultant enable signal AN as shown in FIG. 6I to the decoder. The ninth inverter 98 inverts the signal on the sixth node N16 and outputs the resultant disable signal ANB as shown in FIG. 6J to the decoder.

On the other hand, in the case where the address signal Ai goes from high to low in level as shown in FIG. 6A, the seventh inverter 94 generates the address transition detect signal ATDB which remains at its low level state for the predetermined time period as shown in FIG. 6F. The second NAND gate 96 performs its NAND operation with respect to the low level address transition detect signal ATDB and the low level signal on the fourth node N14. As a result of the NAND operation, the signal on the sixth node N16 goes from low to high in level as shown in FIG. 6H.

When the predetermined time period has elapsed, the address transition detect signal ATDB goes from low to high in level. The first NAND gate 95 performs its NAND operation with respect to the high level address transition detect signal ATDB and the high level signal on the third node N13. As a result of the NAND operation, the signal on the fifth node N15 goes from high to low in level as shown in FIG. 6G.

The eighth inverter 97 inverts the signal on the fifth node N15 and outputs the resultant enable signal AN as shown in FIG. 6I to the decoder. The ninth inverter 98 inverts the signal on the sixth node N16 and outputs the resultant disable signal ANB as shown in FIG. 6J to the decoder.

In result, the enable signal AN and the disable signal ANB are generated with their high levels non-overlapping for the predetermined time period that the address transition detect signal ATDB remains at its low level state.

As apparent from the above description, according to the present invention, the non-overlapping signal generation circuit can generate the enable signal and the disable signal with their high levels accurately non-overlapping with each other for the active pulse duration of the address transition detect signal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A non-overlapping signal generation circuit comprising:

NORing means for NORing a chip select signal and an address signal;

first inversion means for inverting an output signal from said NORing means;

second inversion means for sequentially inverting an output signal from said first inversion means by an odd number of times;

third inversion means for sequentially inverting the output signal from said first inversion means by an even number of times;

address transition detection means for generating an address transition detect signal in response to the output signal from said first inversion means; and non-overlapping signal generation means for generating an enable signal and a disable signal in response to the address transition detect signal from said address transition detection means and output signals from said second and third inversion means, the enable signal and the disable signal non-overlapping with each other.

2. A non-overlapping signal generation circuit as set forth in claim 1, wherein said second inversion means includes an odd number of inverters connected in series.

3. A non-overlapping signal generation circuit as set forth in claim 1, wherein said third inversion means includes an even number of inverters connected in series.

4. A non-overlapping signal generation circuit as set forth in claim 1, wherein said non-overlapping signal generation means includes:

a first NOR gate for NORing the output signal from said second inversion means and the address transition detect signal from said address transition detection means and outputting the resultant signal as the enable signal; and a second NOR gate for NORing the output signal from said third inversion means and the address transition detect signal from said address transition detection means and outputting the resultant signal as the disable signal.

5. A non-overlapping signal generation circuit as set forth in claim 1, wherein said non-overlapping signal generation means includes:

a first inverter for inverting the address transition detect signal from said address transition detection means;

a first NAND gate for NANDing an output signal from said first inverter and the output signal from said second inversion means;

a second NAND gate for NANDing the output signal from said first inverter and the output signal from said third second inversion means;

a second inverter for inverting an output signal from said first NAND gate and outputting the resultant signal as the enable signal; and a third inverter for inverting an output signal from said second NAND gate and outputting the resultant signal as the disable signal.

* * * * *